United States Patent [19]  [11] 4,174,541
Schmitz  [45] Nov. 13, 1979

[54] BIPOLAR MONOLITHIC INTEGRATED CIRCUIT MEMORY WITH STANDBY POWER ENABLE

[75] Inventor: Charles R. Schmitz, Cupertino, Calif.

[73] Assignee: Raytheon Company, Lexington, Mass.

[21] Appl. No.: 909,334

[22] Filed: May 25, 1978

Related U.S. Application Data

[63] Continuation of Ser. No. 746,362, Dec. 1, 1976, abandoned.

[51] Int. Cl.² ............................ G11C 8/00; G11C 7/00
[52] U.S. Cl. .................................... 365/227; 365/189; 365/230
[58] Field of Search ................... 365/227, 189, 230

[56] References Cited

U.S. PATENT DOCUMENTS

| | | | |
|---|---|---|---|
| 3,599,182 | 8/1971 | Henle | 365/227 |
| 3,631,410 | 12/1971 | Velasco | 340/173 SP |
| 3,680,061 | 7/1972 | Arbab et al. | 365/227 |
| 3,688,280 | 8/1972 | Ayling et al. | 365/227 |
| 3,703,710 | 11/1972 | Kubo et al. | 365/227 |
| 3,790,817 | 2/1974 | Dobkin | 307/317 A |
| 3,806,898 | 4/1974 | Askin | 365/222 |
| 3,859,637 | 1/1975 | Platt et al. | 365/227 |
| 3,867,644 | 2/1975 | Cline | 307/317 A |
| 3,979,611 | 9/1976 | Payne et al. | 307/317 A |
| 3,979,735 | 9/1976 | Payne | 340/173 FF |
| 3,986,045 | 10/1976 | Lutz | 307/317 A |
| 4,023,148 | 5/1977 | Huber et al. | 340/173 R |
| 4,038,564 | 7/1977 | Hakata | 307/205 |

Primary Examiner—Stuart N. Hecker
Attorney, Agent, or Firm—Richard M. Sharkansky; Joseph D. Pannone

[57] ABSTRACT

A bipolar monolithic integrated circuit memory wherein a standby power enable circuit includes a pair of transistors arranged in an active pullup configuration for electrically coupling or decoupling a memory array addressing section of such memory and a ground bus selectively in accordance with a standby enable signal. The standby power enable circuit is connected between the addressing section and the ground bus to reduce the standby power required by the memory. One of the pair of transistors in the active pullup configuration is an N-P-N transistor having a Schottky barrier diode clamp formed as a part of the monolithic integrated circuit memory. The use of such a transistor in the standby power enable circuit ensures rapid switching operation of the memory.

16 Claims, 6 Drawing Figures

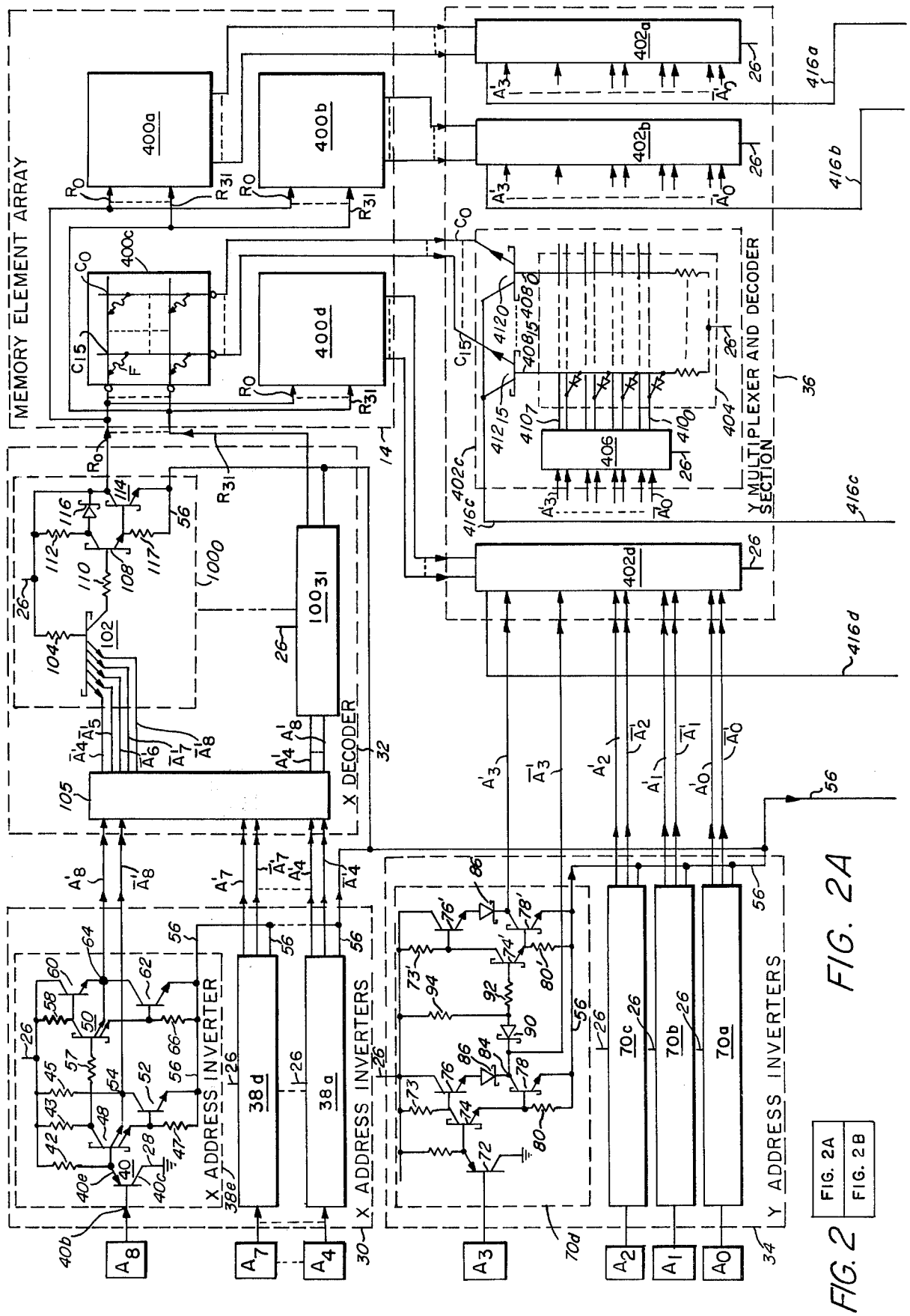

BIPOLAR MONOLITHIC INTEGRATED CIRCUIT MEMORY WITH STANDBY POWER ENABLE

CROSS-REFERENCE TO RELATED CASES

This is a continuation of application Ser. No. 746,362, filed Dec. 1, 1976, now abandoned.

BACKGROUND OF THE INVENTION

This invention relates generally to bipolar monolithic integrated circuit read only memory (ROM) and programmable read only memory (PROM) components are more particularly to standby power enable circuitry used in such ROM/PROM components and programming enable circuitry used in such PROM components.

As is known in the art, bipolar monolithic integrated circuit ROM/PROM components are widely used for storage of program and microprogram control instructions because such components are relatively fast and nonvolatile, retaining such instructions even when supply power is removed. Such bipolar monolithic integrated circuit ROM/PROM components generally include a memory element array coupled to addressing and output circuitry. Such addressing circuitry includes N-P-N output transistors, each having an emitter electrode connected to a ground bus, a collector electrode coupled to a $+V_{cc}$ bus and a base electrode coupled to a control signal for switching such transistor between an "on" or saturation state and an "off" state selectively in accordance with the control signal. In order to reduce the amount of power consumed by the addressing circuitry when such component is not selected standby power enable circuitry is included in the component. However, even when such component is in a standby condition such standby circuitry has heretofore resulted in an undesirable amount of power consumption, typically in the order of 500 milliwatts per component. One such standby power enable circuit includes the use of a P-N-P switching transistor having its emitter electrode coupled to the positive terminal ($V_{cc}'$) of a power supply, its base electrode coupled to an enable signal source and also coupled to the $V_{cc}'$ power supply terminal through a resistor and its collector electrode coupled to the $+V_{cc}$ bus of the component. In order to minimize the ROM/PROM access time it is desirable that the P-N-P switching transistor be a high speed device. One class of high current/high speed transistors is a transistor having a Schottky-barrier diode clamp formed between the base and collector regions of such transistor. Such Schottky-barrier diode clamp may be readily formed in a monolithic integrated circuit with N-P-N transistors by forming a platinum silicide layer under the base region metal contact which extends under such contact from a portion of the base region of a P type conductivity to an adjacent portion of the collector region of N type conductivity material. The interaction of the platinum and the N type silicon forms a diode between the base and collector regions of the transistor. Such fabrication technique, however, is not available in the formation of P-N-P Schottky barrier diode transistors.

A second standby power enable circuit includes the use of an N-P-N emitter follower transistor having a pullup resistor coupled between the base electrode of such transistor and the positive terminal, $V_{cc}'$, of the power supply. The emitter electrode of such N-P-N transistor is coupled to the $+V_{cc}$ bus and the collector electrode is coupled to the positive terminal $V_{cc}'$ of the power supply. The N-P-N transistor is "off" (i.e. the component therefor disabled) when a "low" signal is supplied to the base electrode of the N-P-N transistor. Here, however, power dissipation occurs in the pullup resistor when the component is in the standby condition. Further, while it is desirable to minimize the resistance of the pullup resistor in order to minimize the $V_{CE}$ drop between $V_{cc}'$ and $+V_{cc}$ when the component is enabled, reducing the resistance of the pullup resistor increases the power consumption in such pullup resistor when the component is in the disable condition.

SUMMARY OF THE INVENTION

With this background of the invention in mind it is therefore an object of this invention to provide an improved memory enable circuit.

It is another object of this invention to provide an improved standby power enable circuit.

It is another object of this invention to provide an improved high speed memory standby power enable circuit suitable for monolithic integrated circuit fabrication.

It is another object of this invention to provide improved monolithic integrated circuit ROM/PROM components having high speed standby power enable circuitry.

These and other objects of the invention are attained generally by providing a monolithic integrated circuit wherein a memory array addressing circuit is coupled to or decoupled from a ground bus through a transistor having a Schottky barrier diode formed between the base and collector regions thereof selectively in accordance with an enable signal. In a preferred embodiment the monolithic integrated circuit comprises: A substrate of semi-conductor material; a first conductive bus formed on such substrate adapted for coupling to a relatively positive electrical potential of a power supply; a second conductive ground bus, formed on such substrate, adapted for coupling to a relatively negative electrical potential of the power supply; a third conductive bus; a memory element array formed on said substrate; an address section comprised of a plurality of interconnected active and passive elements formed on said substrate, such section including a plurality of output transistors, each one being adapted to switch between a conducting state and a nonconducting state selectively in accordance with control signals coupled to the base electrode thereof, each one of such transistors having a collector electrode coupled to the first conductive bus and an emitter electrode connected to the third conductive bus; and, a standby power enable circuit, formed on such substrate, including a pair of transistors arranged in an active pullup configuration, one of such pair of transistors having an emitter electrode connected to the second conductive ground bus, a collector electrode connected to the third conductive bus and a Schottky diode formed between the collector region and base region of such one of said pair of transistors.

BRIEF DESCRIPTION OF THE DRAWINGS

The foregoing features of this invention, as well as the invention itself, may be more fully understood from the following detailed description read together with the accompanying drawings, in which:

FIG. 2 is a diagram showing the relationship between FIGS. 2A and 2B;

FIGS. 2A and 2B, taken together, are a schematic diagram of the PROM of FIG. 1;

DESCRIPTION OF THE PREFERRED EMBODIMENT

Figure 1:
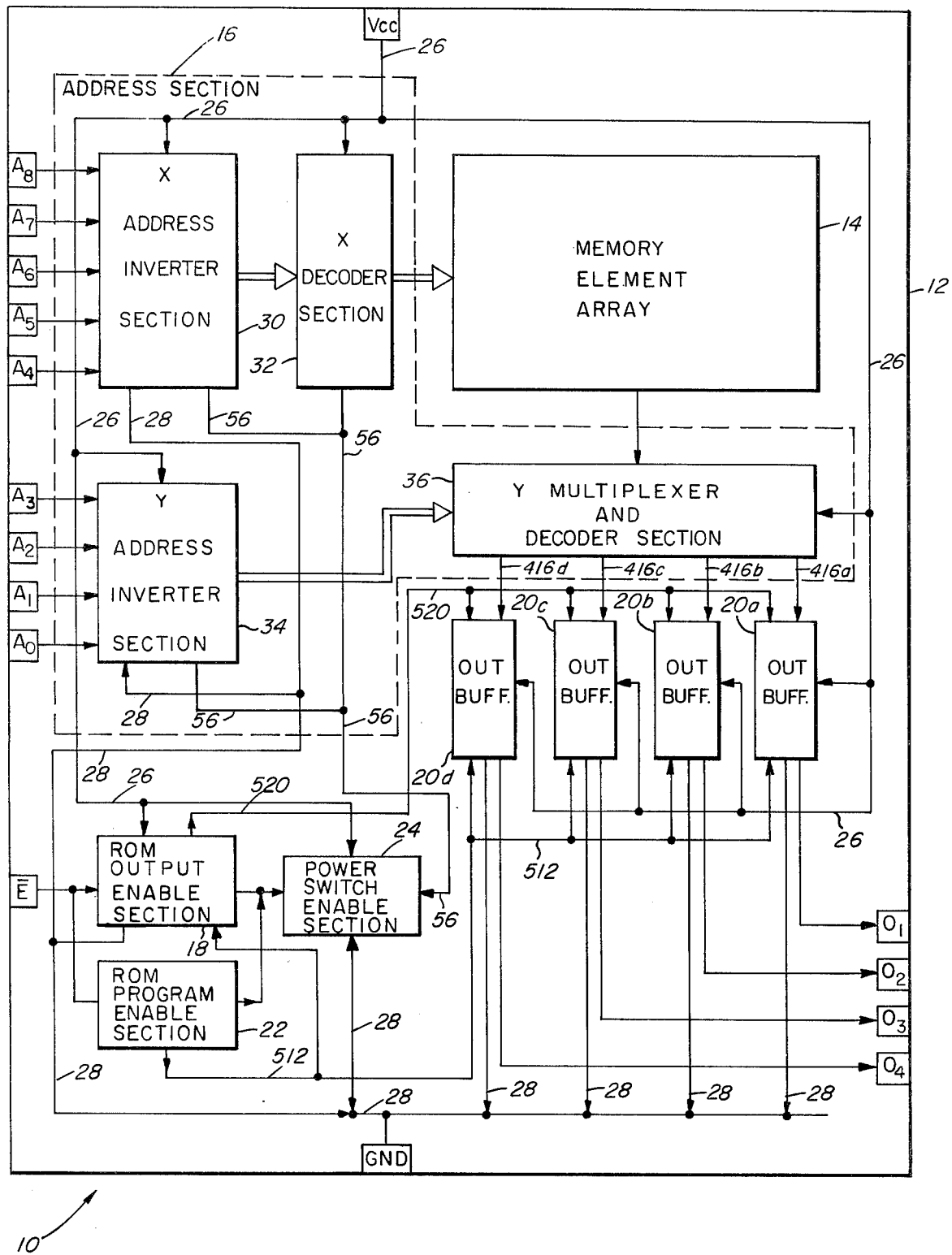
FIG. 1 is a block diagram of a programmable read only memory (PROM) according to the invention.

Referring now to FIG. 1, a programmable read only memory (PROM) 10 is shown formed on a single crystal semiconductor substrate 12, here P type conductivity silicon, using conventional monolithic integrated circuit fabrication techniques. Such PROM 10 includes: A memory element array 14 adapted for storing, in a manner to be described, 2048 bits of information arranged as 512 four bit digital words; an address section 16 for addressing such array 14 in accordance with binary signals supplied from an address signal source (not shown) to input pads $A_0$–$A_8$; a ROM output enable section 18 for enabling a selected one of the 512 four bit digital words to be coupled through output buffers $20a$–$20d$ to output pads $O_1$–$O_4$ in a manner to be described; a ROM program enable section 22 for enabling bits of information to be stored in the memory element array 14 in response to a program enable signal supplied to enable pad $\overline{E}$ in a manner to be described; a power switch enable section 24 for enabling power from a +5 volt power supply (not shown) to be coupled to the address section 16 in response to a standby or chip enable signal supplied by a standby or chip enable signal source (not shown) to enable pad $\overline{E}$ in a manner to be described; a $+V_{cc}$ bus 26 adapted for coupling to the relative positive electrical potential of the +5 volt power supply (not shown) via a $+V_{cc}$ pad; and, a ground bus 28 adapted for coupling to the relative negative (i.e. ground) electrical potential of the +5 volt power supply (not shown) via a pad GND.

Address section 16 includes an X address inverter section 30, an X decoder section 32, a Y address inverter section 34 and a Y multiplexer and decoder section 36, the details of which are shown in FIG. 2A. Referring first to the X address inverter section 30, such section is shown to include a plurality (here five) of identical X address inverters $38a$–$38e$, coupled to corresponding ones of the input pads $A_4$–$A_8$, respectively, as shown. An exemplary one of such X address inverters, say X address inverter $38e$, is shown to include a P-N-P transistor 40 having its base electrode 40b connected to input pad $A_8$, its emitter electrode 40e coupled to the $+V_{cc}$ bus 26 through a resistor 42 and its collector electrode 40c connected to the ground bus 28. The formation of such P-N-P transistor 40 in the substrate 12 is shown in FIG. 3. Such transistor 40 is electrically isolated from other active devices formed on the substrate 12 by P+ type conductivity regions 42 which are diffused into an N type conductivity epitaxial layer 44 as shown. An N+ type conductivity region 46 is diffused into the epitaxial layer 44 as shown to form the base contact region of such transistor 40 and a P type conductivity region 48 is diffused into the epitaxial layer 44 as shown to form the emitter region of the transistor 40. The base electrode 40b is formed over oxide layer 49 in ohmic contact with the base contact region 46, the emitter electrode 40e is formed in ohmic contact with the emitter region 48 and the collector electrode 40c is formed in ohmic contact with the P+ type conductivity isolation region 42, as shown, using conventional monolithic integrated circuit fabrication methods. The P type conductivity substrate 12 therefore provides the collector region for the transistor 40 and the collector electrode 40c is connected to the ground bus 28 (FIG. 2A) and enables such ground bus 28 to be coupled to the collector region (i.e. the substrate 12) of transistor 40 via the P+ type conductivity isolation region 42.

Referring again to the X address inverter $38e$ shown in FIG. 2A, the emitter electrode 40e of transistor 40 is also connected to the base electrode of an N-P-N multiple emitter transistor 48, here being formed with a Schotsky barrier diode clamp. The collector electrode of transistor 48 is coupled to the $+V_{cc}$ bus 26 through a resistor 43 as shown. One emitter electrode of transistor 48 is connected to the collector electrode of transistor 52 at a terminal 54, as shown, such terminal 54 being coupled to the $+V_{cc}$ bus 26 through a resistor 45 and to a line $\overline{A_8}'$. The second emitter of transistor 48 is connected to the base electrode of transistor 52 and to a switched ground bus 56 through a resistor 47. The emitter electrode of transistor 52 is also connected to the switched ground bus 56, as shown. It is here noted that, referring to FIG. 1, the switched ground bus 56 provided in the address section 16 becomes coupled to the ground bus 28 by the power switch enable section 24 when the PROM 10 is placed in an enable mode and such switched ground bus 56 is decoupled from the ground bus 28 by such power switch enable section 24 when such PROM 10 is placed in a standby mode, one of such modes being selected in accordance with the standby or chip enable signal applied to pad $\overline{E}$ in a manner to be described. Suffice it to say here, however, that when the switched ground bus 56 is coupled to the ground bus 28 (i.e. the PROM 10 is enabled), the PROM 10 is coupled to the +5 volt power supply (not shown), and the signal developed on line $\overline{A_8}'$ is the complement of the signal on input pad $A_8$ because: (1) when the signal on input pad $A_8$ is high (i.e. logical 1) transistor 40 turns off and transistors 48 and 52 turn on, thereby coupling terminal 54 to the switched ground bus 56, and hence to ground potential to produce a low (i.e. logical 0) signal on line $\overline{A_8}'$; and (2) when the signal on input pad $A_8$ is low, transistor 40 turns on, turning transistors 48 and 52 off, thereby decoupling terminal 54 from bus 56 to produce a high signal on line $\overline{A_8}'$. It is noted that when the PROM is in a standby mode and switched ground bus 56 is decoupled from the ground bus 28 transistors 48, 52 are essentially in a nonconductive mode so that there is substantially no power loss through resistors 43, 45, 47. The collector electrode of transistor 48 is coupled to the base electrode of transistor 50 through a resistor 57, as shown. The collector electrode of transistor 50 is coupled to the $+V_{cc}$ bus 26 through a resistor 58 and to the base electrode of transistor 60 as shown. One emitter electrode of transistor 50 is coupled to the emitter electrode of transistor 60 and to the collector electrode of transistor 62 at a terminal 64. A second electrode of transistor 50 is connected to the base electrode of transistor 62 and to the switched ground bus 56 through a resistor 66, as shown. The emitter electrode of transistor 62 is connected to switched ground bus 56. Line $A_8'$ is connected to terminal 64 and, when the switched ground bus 56 is coupled to ground bus 28 by the power switch enable section 24 (FIG. 1), the signal on such line $A_8'$ is the true of the signal on input pad $A_8$, the operation of transistors 50 and 62 in response to the signal on the base electrode of transistor 50 being equivalent to the operation of transistors 48 and 52 in response to the signal on the base electrode of transistor 48. When the PROM 10 is in a standby mode, i.e. switched ground bus 56 is decoupled from ground bus 28, it should be noted that transistors 50, 60 and 62 are essentially nonconductive and hence substantially no power is dissipated in resistors 57, 58 and 66.

Referring now to the Y address inverter section 34, such section is shown to include a plurality of, here four, identical Y address inverters 70a-70d, such inverters 70a-70d being coupled to corresponding ones of the input pads $A_0$-$A_3$, respectively, as shown. An exemplary one of such inverters 70a-70d, here inverter 70d, is shown to include a P-N-P transistor 72 here formed in a manner equivalent to the formation of transistor 40 (FIG. 3). Such transistor 72 has its base electrode coupled to the input pad $A_3$, as shown. The collector electrode of such transistor 72 is coupled to the $+V_{cc}$ bus 26 through a resistor (not numbered) and to the base electrode of transistor 74, as shown. Transistor 74 has its collector electrode coupled to both the base electrode of transistor 76 and to the $+V_{cc}$ bus 26 through a resistor 73 and its emitter electrode coupled to the base electrode of transistor 78 and to the switched ground bus 56 through a resistor 80, as shown. Transistor 76 has its collector electrode coupled to the $+V_{cc}$ bus 26 and its emitter electrode coupled to a terminal 84 through a Schottky diode 86, as shown. Transistor 78 has its collector electrode coupled to terminal 84 and its emitter eectrode coupled to the switched ground bus 56, as shown. Line $\overline{A_3}'$ is coupled to terminal 84. When the PROM 10 is in the enable mode, i.e. the switched ground bus 56 is coupled to the ground bus 28, the signal on line $\overline{A_3}'$ is the complement of the signal on input pad $A_3$ because: (1) when the signal on input pad $A_3$ is high transistor 72 turns off and transistors 74 and 78 turn on, thereby coupling terminal 84 to ground; and (2) when the signal on input pad $A_3$ is low transistor 72 turns on, thereby turning off transistors 74 and 78 to place terminal 84 at a high level. The signal at terminal 84 is fed to the base electrode of transistor 74' through a Schottky diode 90 and resistor 92 as shown. (The common junction between such diode 90 and resistor 92 is coupled to the $+V_{cc}$ bus 26 through a resistor 94, as shown.) Transistors 74', 76' and 78', resistors 80', 73' and diode 86' are arranged as the transistors 74, 76 and 78, resistors 80, 73 and diode 86, respectively, as described above. It follows then that when the PROM 10 is in the enable mode (i.e. switched ground bus 56 is coupled to ground bus 28) the signal on line $A_3'$ (i.e. the signal at the collector electrode of transistor 78') is the true of the signal at input pad $A_3$. Likewise, when the PROM 10 is in the standby mode, substantially no power is dissipated in resistors 73' and 80'.

Referring now to X decoder section 32, such section 32 is shown to include a plurality of, here 32, identical NAND logic gates $100_0$-$100_{31}$. An exemplary one of such logic gates, here logic gate $100_0$, is shown to include a multiple emitter input transistor 102 having its base electrode coupled to the $+V_{cc}$ bus 26 through a resistor 104. Here transistor 102 has five emitter electrodes, each one being coupled to a corresponding one of the X address inverters 38a-38e through an interconnecting section 105. Interconnecting section 105 includes a plurality of connectors (not shown) for connecting: lines $\overline{A_4}'$, $\overline{A_5}'$, $\overline{A_6}'$, $\overline{A_7}'$ and $\overline{A_8}'$ to the corresponding ones of the five emitter electrodes of transistors 102. The collector electrode of transistor 102 is coupled to the base electrode of a transistor 108 through a resistor 110, as shown. Transistor 108 has its collector electrode coupled to the $+V_{cc}$ bus 26 through a resistor 112 and to the collector electrode of a transistor 114 through a Schottky diode 116, as shown. The emitter electrode8of transistor 108 is coupled to the switched ground bus 56 through a resistor 117 and to the base electrode of transistor 114, as shown. The emitter electrode of transistor 114 is connected to the switched ground bus 56. The collector electrode of transistor 114 is connected to the $+V_{cc}$ bus 26, as shown. When PROM 10 is enabled (i.e. switched ground bus 56 is coupled to ground bus 28) transistor 114 turns on in response to high signals on each of the lines $\overline{A_4}'$, $\overline{A_5}'$, $\overline{A_6}'$, $\overline{A_7}'$ and $\overline{A_8}'$ and turns off when the signal on any one of such lines goes low. The signal at the collector electrode of transistor 114 is coupled to line $R_0$. Therefore, line $R_0$ is at a low level in response to a binary word 0 0 0 0 0 on input pads $A_4$-$A_8$, respectively, and is at a high level for any other binary signal on such input pads. Likewise, when PROM 10 is enabled, because of the connection (not shown) provided by interconnecting section 105, gate $100_0$ through gate $100_{31}$ produce high signals on lines $R_0$-$R_{31}$, respectively, in response to the binary signals on input pads $A_4$-$A_8$ in accordance with the following table:

| Binary Signals on Input Pads | | | | | Line at Low Level | Lines at High Level |
| --- | --- | --- | --- | --- | --- | --- |
| $A_4$ | $A_5$ | $A_6$ | $A_7$ | $A_8$ | | |
| 0 | 0 | 0 | 0 | 0 | $R_0$ | $R_1$-$R_{31}$ |
| 1 | 0 | 0 | 0 | 0 | $R_1$ | $R_0$, $R_2$-$R_{31}$ |
| . | . | . | . | . | . | . |
| . | . | . | . | . | . | . |
| . | . | . | . | . | . | . |
| 0 | 1 | 1 | 1 | 1 | $R_{30}$ | $R_0$-$R_{29}$, $R_{31}$ |
| 1 | 1 | 1 | 1 | 1 | $R_{31}$ | $R_0$-$R_{30}$ |

Lines $R_0$-$R_{31}$, i.e. the lines provided at the output of gates $100_0$-$100_{31}$, respectively, are coupled to the memory element array 14. When the PROM 10 is in a disabled mode transistors 102, 108 and 114 are in nonconducting states and therefore substantially no power is dissipated in resistors 104, 110, 112 and 117.

Before discussing the details of the Y multiplexer and decoder section 36, it should be noted that the memory element array 14 includes four identical diode matrices 400a-400d, as shown. An exemplary one of such diode matrices 400a-400d, here diode matrix 400c, is shown in detail to include a rectangular matrix of rows and columns of conductors, in particular 32 rows of conductors coupled to lines $R_0$-$R_{31}$, respectively, as shown, and, here, 16 columns of conductors $C_0$-$C_{15}$, as indicated. The rows and columns of conductors are, prior to programming, interconnected by conventionally fusible links and diodes as, for example, described in the book entitled "The Integrated Circuit Catalogue For Design Engineers," Texas Instruments, Incorporated, Dallas, Texas, page 9-366. The programming and reading of the memory element array 14 will be discussed later; suffice it to say here, however, that such array 14 is programmed by passing current through selected ones of such fusible links to open circuit such fusible links and data is read from such array by determining whether a selected fusible link is open circuited.

Referring now to the Y multiplexer and decoder section 36, such section 36 is shown to include a plurality of, here 4, identical diode decoder sections 402a–402d, as shown. An exemplary one of such decoder sections 402a–402d, say decoder section 402c, is shown to include a diode decoder 404 coupled to the $+V_{cc}$ bus 26 and to the signals on lines $A_0'$, $\overline{A}_0'$, $A_1'$, $\overline{A}_1'$, $A_2'$, $\overline{A}_2'^{cc}$, $A_3'$, $\overline{A}_3'$ via interconnecting structure 406. Such diode decoder 404 includes a matrix of 16 columns of conductors, $408_0$–$408_{15}$, and eight rows of conductors, $410_0$–$410_7$, as indicated. The conductors $410_0$–$410_7$ are coupled to corresponding ones of the lines $A_0'$–$A_3'$ and $\overline{A}_0'$–$\overline{A}_3'$ by the interconnecting structure 406 in accordance with the following Table:

| Line | Connected to | Line |
|---|---|---|
| $A'_0$ | → | $410_4$ |
| $\overline{A}'_0$ | → | $410_5$ |
| $A'_1$ | → | $410_2$ |
| $\overline{A}'_1$ | → | $410_3$ |
| $A'_2$ | → | $410_0$ |
| $\overline{A}'_2$ | → | $410_1$ |
| $A'_3$ | → | $410_6$ |
| $\overline{A}'_3$ | → | $410_7$ |

The conductors $408_0$–$408_{15}$ are connected to the base electrodes of transistors $412_0$–$412_{15}$, respectively, as indicated. The emitter electrodes of transistors $412_0$–$412_{15}$ are connected to lines $C_0$–$C_{15}$, respectively, as indicated. The collector electrodes of transistors $412_0$–$412_{15}$ are connected in common to line $416_c$, as shown. Line $416_c$ is fed to output buffer 20c (FIG. 1), such output buffer 20c being coupled to output pad $O_3$ (FIG. 1). The operation and construction of the output buffer 20c will be described hereinafter; suffice it to say here, however, that, when PROM 10 is enabled for programming current flows from a +20 voltage power supply (not shown) coupled to output pad $O_3$ to the emitter electrode of a selected one of the transistors $412_0$–$412_{15}$ vi line 416c and then to a selected one of the 16 columns of conductors $C_0$–$C_{15}$ in the diode matrix 400c. The particular one of the transistors $412_0$–$412_{15}$ is selected in accordance with the signals on lines $A_0'$–$A_3'$ and $\overline{A}_0'$–$\overline{A}_3'$. The following table describes the relationship between the signals on lines $A_0'$–$A_3'$ and $\overline{A}_0'$–$\overline{A}_3'$ and the selected one of the transistors $412_0$–$412_{15}$:

| Signal On Lines | | | | | | | | Selected |
|---|---|---|---|---|---|---|---|---|
| $A'_0$ | $\overline{A}'_0$ | $A'_1$ | $\overline{A}'_1$ | $A'_2$ | $\overline{A}'_2$ | $A'_3$ | $\overline{A}'_3$ | Transistor |
| H | L | H | L | H | L | H | L | $412_{15}$ |
| L | H | H | L | H | L | H | L | $412_{14}$ |
| H | L | L | H | H | L | H | L | $412_{13}$ |
| L | H | L | H | H | L | H | L | $412_{12}$ |
| H | L | H | L | L | H | H | L | $412_{11}$ |
| L | H | H | L | L | H | H | L | $412_{10}$ |
| H | L | L | H | L | H | H | L | $412_9$ |
| L | H | L | H | L | H | H | L | $412_8$ |
| H | L | H | L | H | L | L | H | $412_7$ |
| L | H | H | L | H | L | L | H | $412_6$ |
| H | L | L | H | H | L | L | H | $412_5$ |
| L | H | L | H | H | L | L | H | $412_4$ |
| H | L | H | L | L | H | L | H | $412_3$ |
| L | H | H | L | L | H | L | H | $412_2$ |
| H | L | L | H | L | H | L | H | $412_1$ |

-continued

| Signal On Lines | | | | | | | | Selected |
|---|---|---|---|---|---|---|---|---|
| $A'_0$ | $\overline{A}'_0$ | $A'_1$ | $\overline{A}'_1$ | $A'_2$ | $\overline{A}'_2$ | $A'_3$ | $\overline{A}'_3$ | Transistor |
| L | H | L | H | L | H | L | H | $412_0$ |

L = low signal level
H = high signal level

Current passes through the selected one of the transistors $412_0$–$412_{15}$ and therefore through a selected one of the 16 columns $C_0$–$C_{15}$ of matrix 400c to a selected one of the rows $R_0$–$R_{31}$ via the fusible link connected between such selected row and column. Such current is of sufficient magnitude to open circuit such fusible link. One of the 32 rows is selected by turning on the transistor 114 in a selected one of the 32 gates $100_0$–$100_{31}$. For example, if the row connected to line $R_0$ is to be selected the input signals on pads $A_4$–$A_8$ are 00000. Therefore, the signals on lines $\overline{A}_4'$–$\overline{A}_8'$ are high, transistor 102 turns off and transistor 114 turns on (assuming the PROM 10 is enabled, i.e. switched ground bus 56 is coupled to ground bus 28). Therefore, if the fusible link F is to be "opened," the signals on pads $A_0$–$A_8$ are 1 1 1 1 0 0 0 0, respectively, because current flows from the +20 volt power supply (not shown) coupled to the output pad $O_3$ to output buffer 20c, then to line $C_{15}$ through fuzible link F, then through line $R_0$, transistor 114, switched ground bus 56, power switch enable section 24 (FIG. 1) to ground bus 28 and finally to the +20 volt power supply ground terminal (not shown). In this manner output buffers 402a–402d provide the "column addresses" for fusible links in matrices 400a–400d, respectively. The "row" address of the fuzible links in all matrices 400a–400d is selected by the signals on lines $R_0$–$R_{31}$ because such lines are fed to all matrices 400a–400d, as shown.

Figure 2B:
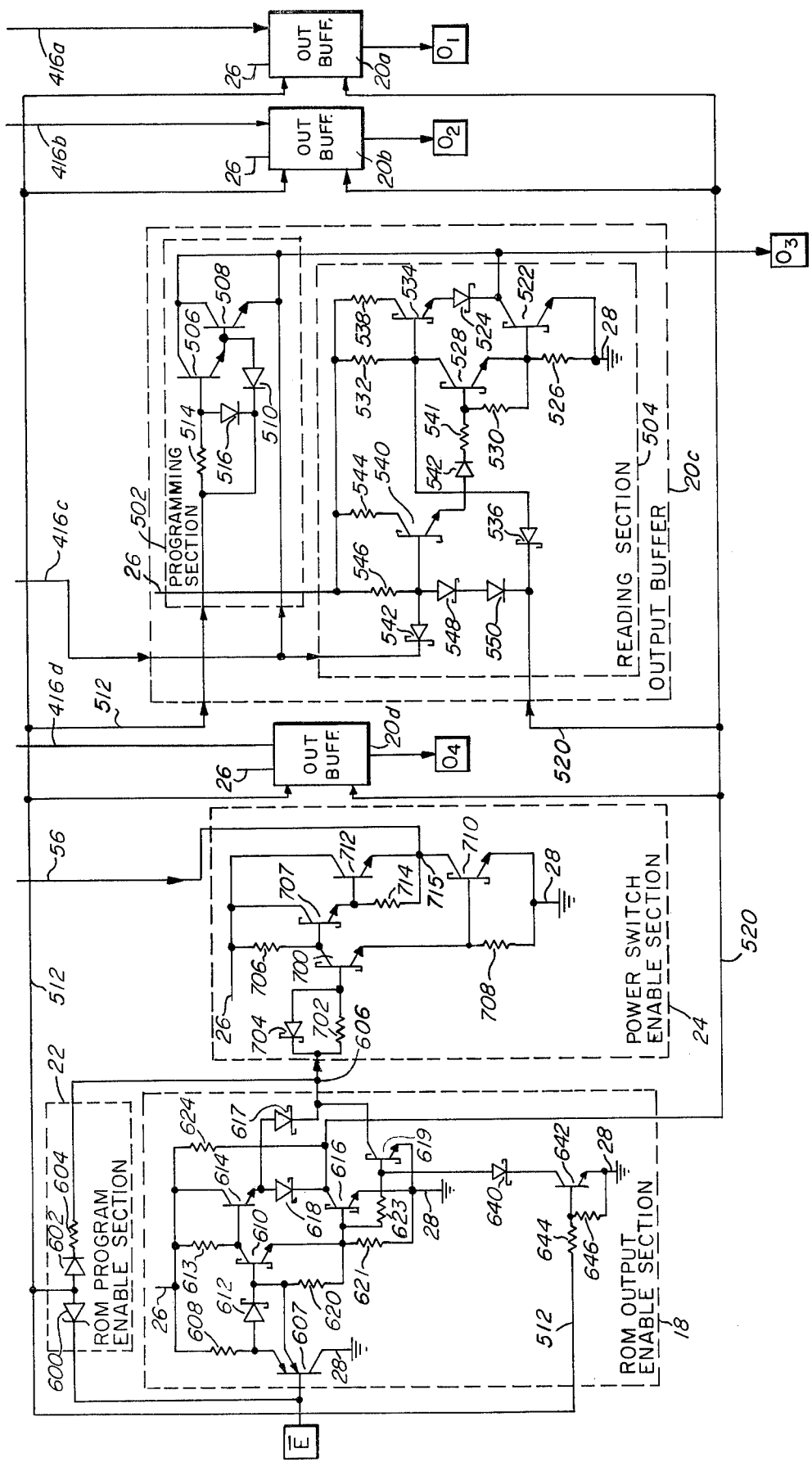
Figure 3:
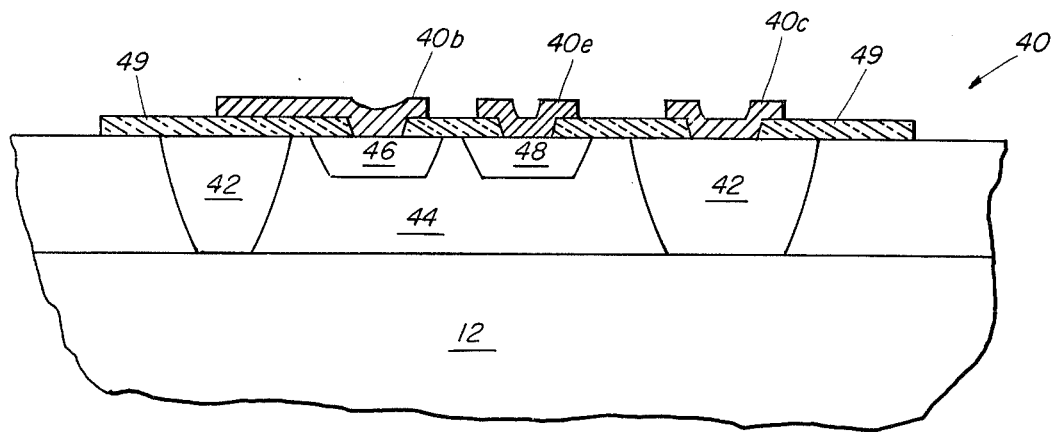
FIG. 3 is a cross-sectional diagram, somewhat distorted, of a P-N-P transistor used in the PROM of FIG. 1.

Referring now also to FIG. 2B, an exemplary one of the output buffers 20a–20d, say output buffer 20c, is shown to include a programming section 502 and a reading section 504. The programming section 502 includes a pair of transistors 506, 508 arranged in a Darlington configuration, the emitter electrode of transistor 508 being connected to line 416c, the collector electrodes of transistors 506, 508 being connected to the output pad $O_3$, the emitter electrode of transistor 506 being connected to a diode 510 and the base electrode of transistor 508, as shown. The base electrode is coupled to the output of PROM program enable section 22 via line 512 through a resistor 514 and diode 516, as shown. The cathodes of diodes 516, 510 are connected together to line 512, as shown. The reading section 504 includes a transistor 522 having its emitter electrode coupled to ground bus 28, its collector electrode coupled to a Schottky diode 524 and the output pad $O_3$, as shown, and its base electrode coupled to the ground bus 28 through resistor 526, the base electrode of transistor 528 through resistor 530 and to the emitter electrode of transistor 528, as shown. The collector electrode of transistor 528 is coupled to the $+V_{cc}$ bus 26 through resistor 532, the base electrode of transistor 534 and the anode of Schottky diode 536, as shown. The collector electrode of transistor 534 is coupled to the $+V_{cc}$ bus 26 through resistor 538, as shown. The emitter electrode of transistor 534 is connected to the anode of Schottky diode 524, as shown. The base electrode of transistor 528 is coupled to the emitter electrode of transistor 540 through diode 542 and resistor 541, as shown. The collector electrode of transistor 540 is coupled to the $+V_{cc}$ bus 26 through resistor 544, as shown. The base electrode of transistor 540 is coupled to the $+V_{cc}$ bus 26 through resistor 546, the cathode of diode 536 through Schottky diode 548 and diode 550, as shown, and line 416c through Schottky diode 542, as shown. The details of ROM program enable section 22 and the power switch enable section 24 will be described later. Suffice it to say here, however, that when a program enable signal is applied to pad $\overline{E}$, line 512 develops a voltage, here +21 volts, and the ground bus 28 becomes coupled to switched ground bus 26 by power switch enable section 24. In response to such +21 volts base current is supplied to transistors 506, 508 and current flows from the positive potential of power supply (not shown) coupled to output pad $O_3$ through such transistors 506, 508 to line 416c to ground bus 28 (i.e. the negative potential of the supply) thereby to open a selected fusible link in matrix 400c as described above. During this programming operation ROM output enable section 18 produces a low voltage on line 520 for reasons to become apparent. Line 520 is connected to the cathode of diode 550 and the cathode of Schottky diode 536, as shown. Therefore, the low voltage on line 520 during the programming operation forward biases diodes 543, 550 to turn transistor 540 off and back biases diode 542. Further, because transistor 540 is turned off, transistors 528 and 522 turn off, thereby preventing the positive polarity of the power supply (not shown) coupled to the output pad $O_3$ from being coupled to the ground bus 28 through transistor 522. When the reading operation is selected, line 512 is, for reasons to become apparent, open circuited. Hence current flow is inhibited in the transistors 506, 508. Further, for reasons to become apparent, the signal on line 520 is high and diodes 548, 550 and 536 become back-biased, thereby enabling transistor 540 to be turned on or off selectively in accordance with the level of the signal on line 416c. The level of the signal on line 416c depends on whether a fusible link, as selected by the signals on address pads $A_0-A_8$, is open circuited or not open circuited. For example, assuming that ROM 10 is enabled (i.e. the switched ground bus 56 is coupled to the ground bus 28), one of the selected rows (i.e. one of the lines $R_0-R_{31}$) is coupled to the switched ground bus 56 via "on" transistor 114 and hence is at a low voltage level. Also, current is allowed to pass through a selected one of the columns of connectors $C_0-C_{15}$. Therefore, if, for example, row $R_0$ is selected and connector $C_{15}$ is selected current will or will not flow through transistor $412_{15}$, depending on whether fusible link F is in circuit or is not in circuit. Therefore, if such link F is in circuit line 416c will be low, transistor 540 will turn off, transistor 528 will turn off, transistor 522 will turn off and a high voltage will be produced at the output pad $O_3$. If fusible link F is not in circuit current will not flow through transistor $412_{15}$ to line 416c, transistor 540 will turn on, transistor 528 will turn on and transistor 522 will turn on thereby producing a low signal on output pad $O_3$.

Referring now to ROM program enable section 22, such section is shown to include a Zener diode 600, here a six volt Zener diode, a diode 602 and resistor 604, all serially connected as shown between enable pad $\overline{E}$ and the input terminal 606 of power switch enable section 24. Line 512 is connected between Zener diode 600 and diode 602, as shown. ROM output enable section 18 includes a multiple emitter transistor 607 (formed in a manner similar to the formation of the transistor 40 (FIG. 3)), such transistor 607 having its base electrode connected to enable pad $\overline{E}$, its collector electrode connected to ground bus 28, one emitter electrode coupled to the $+V_{cc}$ bus 26 through a resistor 608 and to the base electrode of transistor 610 through a Schottky diode 612 and its second emitter electrode connected to the base electrode of transistor 610, as shown. The collector electrode of transistor 610 is coupled to the $+V_{cc}$ bus 26 through a resistor 613 and to the base electrode of transistor 614, as shown. The collector electrode of transistor 614 is connected to the $+V_{cc}$ bus 26 and the emitter electrode of transistor 614 is coupled to the collector electrode of transistor 616 through a Schottky diode 618 and the collector electrode of transistor 619 through a Schottky diode 617, as shown. The base electrode of transistor 616 is connected to the emitter electrode of transistor 610, the base electrode of transistor 610 through resistor 620, the base electrode of transistor 619 through resistor 623 and the ground bus 28 through resistor 621, as shown. The emitter electrode of transistor 619 is also connected to ground bus 28. The base electrode of transistor 619 is connected to transistor 642 through Schottky diode 640. The base electrode of transistor 642 is connected to line 512 through resistor 644 and to the emitter electrode of such transistor 642 through a resistor 646. The emitter electrode of transistor 642 is connected to ground bus 28. The emitter electrode of transistor 616 is also connected to the ground bus 28, as shown. The Schottky diode 618 is connected to the collector electrode of transistor 616. Such collector electrode is also connected to the $+V_{cc}$ bus 26 through resistor 624 and to line 520, as shown.

Power switch enable section 24 includes a transistor 700. Such transistor 700 has its base electrode coupled to terminal 606 through a resistor 702 and shunt connected Schottky diode 704, as shown, its collector electrode coupled to the $+V_{cc}$ bus 26 through resistor 706 and to the base electrode of transistor 707 as shown and its emitter electrode coupled to ground bus 28 through resistor 708 and to the base electrode of transistor 710, as shown. Transistor 707 has its collector electrode connected to the $+V_{cc}$ bus 26 and its emitter electrode connected to the base electrode of transistor 712 and to the emitter electrode of transistor 712 through a resistor 714, as shown. Transistor 712 has its collector electrode connected to the $+V_{cc}$ bus 26. The transistor 710 has its emitter electrode connected to the ground bus 28 and its collector electrode connected to the resistor 714 and the emitter electrode of transistor 712 at a terminal 715, as shown. Terminal 715 is connected to switched ground bus 56.

In operation, during programming a +27 volt signal is supplied to enable pad $\overline{E}$ from a power supply (not shown) the ground of such power supply being connected to the ground bus 28. In response to such +27 volt signal transistor 642 turns on, thereby turning transistor 619 off. Consequently, current flows through Zener diode 600, diode 602, resistor 604, resistor 702 to turn transistor 700 and transistor 710 on, thereby to: (1) establish a +21 volt signal on line 512, and (2) couple switched ground bus 56 to ground bus 28 through transistor 710, placing PROM 10 in the enable mode. It should also be noted that transistor 607 turns off and transistors 610 and 616 turn on, thereby placing line 520 at a low level. Consequently, the +21 volt signal on line 512 and the low level signal on line 520 allows current to pass from a +20 volt power supply (not shown) coupled between the output pads $O_1-O_4$ and the ground bus 28 to pass through the programming section 502 of output buffers 20a–20d to selected fusible links as described above.

During the reading operation a low (i.e. +0.3 volt signal is applied to enable pad $\overline{E}$ thereby placing Zener diode 600 in a nonconducting state to open circuit line 512 and thereby to: (1) turn transistor 642 off, and (2) disable the programming section 502 of output buffers 20a–20d (here, of course, a power supply is not coupled to the output pads $O_0$–$O_4$ because such output pads develop logical signals corresponding to each bit of a four bit word read from the programmed PROM 10). The +0.3 volt signal on pad E turns transistor 607 on which turns transistors 610, 616 and 619 off to place line 520 at a high level. Terminal 606 goes high because of the active pullup of "on" transistor 614 and diode 617. Because line 512 is open circuited and line 520 is at a high level, the reading section 504 of output buffers 20a–20d provide output signals on output pads $O_1$–$O_4$ in accordance with the signals on lines 416a–416d, such signals depending on the condition of the fusible links addressed by the signals on input pads $A_0$–$A_8$ as described above. It is noted that the PROM 10 is enabled, (i.e. the switched ground bus 56 is coupled to ground bus 28 through transistor 710) because when transistor 607 turns on in response to the low (i.e. +0.3 volt) signal on enable pad $\overline{E}$ transistors 610, 616 and 619 turn off, thereby providing a high signal at terminal 606 because transistor 614 is "on" as described above. Such high signal turns transistor 700 "on" which in turn turns transistor 710 on to enable the PROM 10.

Figure 4:
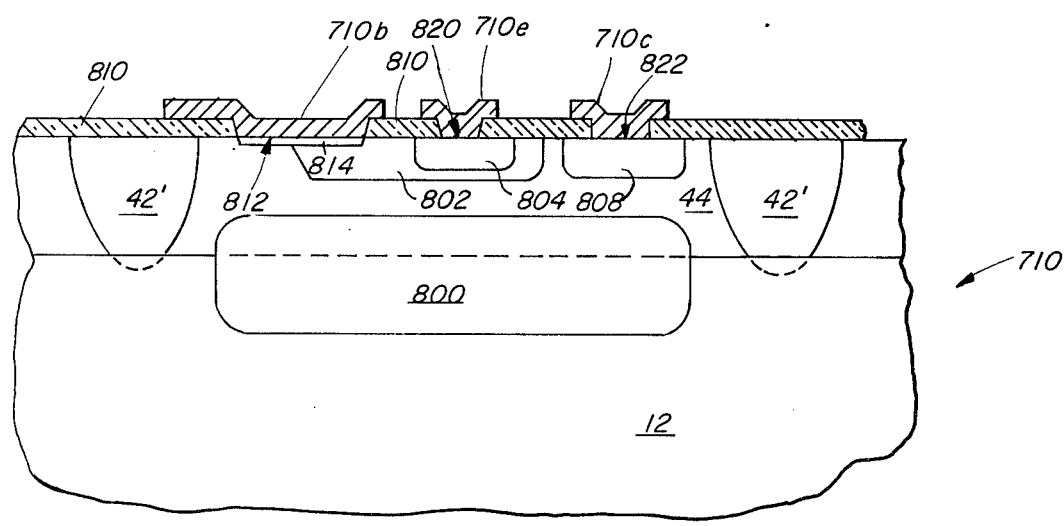
FIG. 4 is a cross-sectional view, somewhat distorted, of an N-P-N transistor used in the PROM of FIG. 1.

To disable (or place in a standby condition) the PROM 10 (i.e. decouple the switched ground bus 56 from the ground bus 28) a high (i.e. +3.5 volt) signal is applied to enable pad $\overline{E}$. Zener diode 600 is placed in a nonconductive state to open circuit line 512 and turn transistor 642 off. Transistor 607 turns off in response to such high signal, thereby turning transistors 610, 616 and 619 on, that is to a conducting state. This in turn causes transistor 710 to turn off. It is noted that the switching of transistor 710 to a nonconducting state, thereby disabling PROM 10, is rapid because of the totem pole, active pullup arrangement of transistors 712 and 710 and also because transistor 710 includes a Schottky barrier diode clamp. In particular, referring to FIG. 4, the construction of transistor 710 is shown. Such transistor 710 is formed by diffusing into substrate 12 an N+ type conductivity subcollector region 800. An epitaxial layer 44 of N type conductivity is grown on the substrate 12. It is noted that there is some outdiffusion of the subcollector region 800 into the epitaxial layer 44 during this process as is well known in the art. Isolation regions 42' are formed around the transistor 710 by diffusing a P+ type conductivity material through the epitaxial layer to the substrate, as shown. A base region 802 is formed in the epitaxial layer 44 by diffusing into such layer 44 P type conductivity material. The emitter region 804 and the collector region 808 are formed, as shown, by diffusing N+ type conductivity material into the base region 802 and the epitaxial layer 44, respectively, as shown. A silicon dioxide layer 810 is then formed over the surface and a window 812 is formed in such epitaxial layer 44 in any well known manner.

It is noted that a window 812 formed in layer 810 extends over a portion of the base regin 802 and over an adjacent portion of the epitaxial layer 44, as shown. A film 814 of platinum silicide is formed in the region exposed by window 812 using any conventional process. Windows 820, 822 are formed in the layer 810 over the emitter region 804 and the collector region 808, respectively, as indicated. Metal contacts 710b, 710e, 710c, or interconnects, are then formed for the base region, emitter region and collector region, respectively, as indicated, such contacts being regarded as the base electrode, emitter electrode and collector electrode of the transistor 710, respectively. It is noted that the platinum silicide film 814 forms a Schottky barrier diode clamp between the base and collector regions of transistor 710.

Having described a preferred embodiment of this invention, it is evident that other embodiments incorporating these concepts may be used. It is felt, therefore, that this invention should not be restricted to the disclosed embodiment, but rather should be limited only by the spirit and scope of the appended claims.

What is claimed is:

1. A monolithic integrated circuit comprising:
  (a) a memory array;
  (b) memory array addressing circuitry for addressing such array in accordance with addressing signals;
  (c) a ground bus;
  (d) a power enable circuit including a transistor having a Schottky barrier diode formed between the base and collector regions thereof, such Schottky transistor being coupled between the addressing circuitry and the ground bus, the base electrode of such transistor being adapted for coupling to an enable signal, such Schottky transistor electrically coupling or decoupling the addressing circuitry and the ground bus selectively in accordance with the enable signal to enable or inhibit current flow in the addressing circuitry selectively in accordance with such enable signal; and
  (e) a semiconductor substrate having formed thereon the memory array, the memory array addressing circuitry, the ground bus and the power enable circuit.

2. The monolithic integrated circuit recited in claim 1 wherein:
  the memory array includes: a matrix of rows and columns of conductors; and coupling elements connected between such conductors;
  the memory array addressing circuitry includes a plurality of driver circuits coupled to the rows and columns of conductors, each one of such driver circuits having an output transistor, such output transistors having:
    (a) collector electrodes coupled to the conductors and adapted for coupling to a power supply;
    (b) base electrodes adapted for coupling to the addressing signals; and
    (c) emitter electrodes connected directly to the collector electrode of the Schottky transistor;
  the Schottky transistor has its emitter electrode connected to the ground bus; and
  such power enable circuit includes a second transistor having an emitter electrode connected to the collector electrode of the Schottky transistor; a collector electrode adapted for coupling to the power supply and a base electrode adapted for coupling to the enable signal.

3. The monolithic integrated circuit recited in claim 2 including a program and output enable section adapted to:

(a) enable programming of the memory array and enable the Schottky transistor to couple the addressing section to the ground bus in response to a first level of the enable signal;

(b) enable reading of the programmed memory array and enable the Schottky transistor to couple the addressing section to the ground bus in response to a second level of the enable signal; and (c) enable the Schottky transistor to decouple the addressing section from the ground bus in response to a third level of the enable signal.

4. The monolithic integrated circuit recited in claim 3 wherein the memory array is comprised of a plurality of fusible links arranged in a matrix of rows and columns.

5. The monolithic integrated circuit recited in claim 4 wherein the program and output enable section includes a Zener diode and wherein such enable signal is coupled to the base electrode of the Schottky transistor through the Zener diode.

6. A monolithic integrated circuit comprising:
(a) a substrate of semiconductor material;
(b) a first conductive bus, formed on such substrate, adapted for coupling to a relatively positive potential of a power supply;
(c) a second conductive ground bus, formed on such substrate, adapted for coupling to a relatively negative electrical potential of the power supply;
(d) a third conductive bus formed on such substrate;
(e) a memory element array formed on said substrate;
(f) addressing circuitry, formed on such substrate, for addressing such memory element array, such addressing circuitry being connected directly to the first conductive bus and the third conductive bus; and
(g) a standby power enable circuit means, formed on such substrate, adapted to couple or decouple the second conductive ground bus and the third conductive bus selectively in accordance with an enable signal, for enabling or inhibiting current flow from the power supply to the addressing circuitry selectively in accordance with the enable signal.

7. The integrated circuit recited in claim 6 wherein the standby power enable circuit includes a Schottky transistor coupled between the second conductive ground bus and the third conductive bus, such transistor being switched between a conducting state and a nonconducting state selectively in accordance with the enable signal.

8. The integrated circuit recited in claim 7 wherein the addressing circuitry includes a plurality of output transistors having base electrodes adapted for coupling to the addressing signals;
collector electrodes coupled to the memory element array and to the first conductive bus, and emitter electrodes connected directly to the third conductive bus; and
wherein the power enable circuit means includes a second transistor having its emitter electrode connected to the collector electrode of the Schottky transistor;
its base electrode adapted for coupling to the enable signal; and its collector electrode coupled to the first conductive bus.

9. The monolithic integrated circuit recited in claim 8 including a program and output enable section adapted to:
(a) enable programming of the memory element array and enable the Schottky transistor to couple the second conductive ground bus to the third conductive bus in response to a first level of the enable signal;
(b) enable reading of the array and to enable the Schottky transistor to couple the second conductive ground bus to the third conductive bus in response to a second level of the enable signal; and
(c) enable the Schottky transistor to decouple the third conductive bus from the second conductive ground bus in response to a third level of the enable signal.

10. The monolithic integrated circuit recited in claim 9 wherein the program and output enable section includes a Zener diode, and wherein such enable signal is coupled to the base electrode of the Schottky transistor through the Zener diode.

11. A monolithic integrated circuit, comprising:
(a) a substrate of semiconductor material;
(b) a first conductive bus, formed on such substrate, adapted for coupling to a relatively positive electrical potential of a power supply;
(c) a second conductive ground bus, formed on such substrate, adapted for coupling to a relatively negative electrical potential of the power supply;
(d) a third conductive bus;
(e) a memory array formed on such substrate, such memory having a matrix of rows and columns of conductors and memory elements connected between such conductors;
(f) address circuitry for addressing such memory array in accordance with address signals, such circuitry being comprised of a plurality of interconnected active and passive elements formed on said substrate including a plurality of output transistors, each one being coupled to the memory array and being adapted to switch to a conducting state or a nonconducting state selectively in accordance with the address signals, such transistors having base electrodes adapted for coupling to the address signals, collector electrodes coupled to both the first conductive bus and selected ones of the conductors of the array; and emitter electrodes connected directly to the third conductive bus; and
(g) a standby power enable circuit, formed on such substrate, including a pair of transistors, one of such pair of transistors having: an emitter electrode connected to the second conductive ground bus; a collector electrode connected to the third conductive bus and a Schottky diode formed between the collector region and the base region of such one of said pair of transistors; and a base electrode fed by a standby signal to enable such transistor to electrically couple or decouple the second conductive ground bus and the third conductive bus selectively in accordance with an enable signal, and the second one of the pair of transistors having an emitter electrode connected to the third conductive bus, a collector electrode coupled to the first conductive bus and a base electrode fed by the standby signal.

12. The monolithic integrated circuit recited in claim 11 including a program and output enable section adapted to:
(a) enable programming of the memory array and to enable the Schottky transistor to couple the second conductive ground bus to the third conductive bus in response to a first level of the enable signal;

(b) enable reading of the memory array and to enable the Schottky transistor to couple the second conductive ground bus to the third conductive bus in response to a second level of the enable signal; and (c) enable the Schottky transistor to decouple the third conductive bus from the second conductive ground bus in response to a third level of the enable signal.

13. The monolithic integrated circuit recited in claim 12 wherein the program and output enable section includes a Zener diode and wherein the enable signal is coupled to the base electrode of the Schottky transistor through the Zener diode.

14. A memory array circuit comprising:
(a) a first conductive bus adapted for coupling to a power supply;
(b) a memory array;
(c) a second conductive bus;
(d) memory array addressing circuitry having output transistors with collector electrodes coupled to the first conductive bus and the memory array and emitter electrodes connected to the second conductive bus, for addressing such array in accordance with addressing signals fed to the base electrodes of such output transistors;
(e) a ground bus adapted for coupling to ground potential of the power supply;
(f) a power enable circuit means, including a bipolar transistor having an emitter electrode and a collector electrode connected between the second conductive bus and the ground bus, for enabling or inhibiting power to be supplied from the power supply to both the addressing circuitry and the memory array selectively in accordance with an enable signal fed to the base electrode of the bipolar transistor; and
(g) a single crystal substrate having formed thereon the first, second and ground buses, the memory array, the addressing circuitry and the power enable circuit means.

15. A memory array circuit comprising:
(a) a first conductive bus adapted for coupling to a positive electrical potential of a power supply;
(b) an array having a matrix of rows and columns of conductors with coupling elements connected between such rows and columns of conductors;
(c) a second conductive bus;
(d) addressing circuitry coupled to the rows and columns of conductors and connected directly between the first conductive bus and the second conductive bus;
(e) a ground bus adapted for coupling to ground potential of the power supply;
(f) a power enable circuit means, including an N-P-N bipolar transistor having a collector electrode and an emitter electrode connected between the second conductive bus and the ground bus, for enabling or inhibiting current flow from the power supply to the addressing circuitry selectively in accordance with an enable signal fed to such N-P-N bipolar transistor, such power circuit enabling means electrically coupling or decoupling the second conductive bus and the ground bus selectively in accordance with such enable signal; and
(g) a single crystal substrate having formed thereon the first, second and ground buses, the array, the addressing circuitry and the power enable circuit means.

16. The circuitry recited in claim 15 wherein the addressing circuitry includes a plurality of output transistors having base electrodes adapted for coupling to addressing signals; collector electrodes coupled to the conductors of the array; and emitter electrodes connected directly to the third conductive bus.

* * * * *